US010366975B1

(12) United States Patent
Zeng et al.

(10) Patent No.: US 10,366,975 B1
(45) Date of Patent: Jul. 30, 2019

(54) ELECTROSTATIC DISCHARGE PROTECTIVE STRUCTURES

(71) Applicant: GLOBALFOUNDRIES Singapore Pte. Ltd., Singapore (SG)

(72) Inventors: Jie Zeng, Singapore (SG); Chai Ean Gill, Chandler, AZ (US)

(73) Assignee: GLOBALFOUNDRIES SINGAPORE PTE. LTD., Singapore (SG)

(*) Notice: Subject to any disclaimer, the term of this patent is extended or adjusted under 35 U.S.C. 154(b) by 0 days.

(21) Appl. No.: 15/988,134

(22) Filed: May 24, 2018

(51) Int. Cl.
    *H01L 23/52* (2006.01)
    *H01L 27/02* (2006.01)
    *H01L 23/60* (2006.01)
    *H02H 9/04* (2006.01)

(52) U.S. Cl.
CPC .......... *H01L 27/0248* (2013.01); *H01L 23/60* (2013.01); *H02H 9/046* (2013.01); *H01L 27/0259* (2013.01); *H01L 27/0262* (2013.01)

(58) Field of Classification Search
CPC .................. H01L 27/0259; H01L 27/0262
See application file for complete search history.

(56) References Cited

U.S. PATENT DOCUMENTS

| | | | |
|---|---|---|---|
| 7,701,012 B2 * | 4/2010 | Xu | H01L 27/0259 257/355 |
| 9,018,072 B2 | 4/2015 | Gendron et al. | |
| 9,177,952 B2 | 11/2015 | Zhan et al. | |
| 9,478,608 B2 | 10/2016 | Salcedo et al. | |
| 9,502,890 B2 * | 11/2016 | Zhan | H02H 9/046 |
| 2014/0347771 A1 * | 11/2014 | Zhan | H02H 9/044 361/56 |
| 2015/0021739 A1 * | 1/2015 | Chen | H01L 29/6625 257/565 |

OTHER PUBLICATIONS

Gendron et al., "New High Voltage ESD Protection Devices Based on Bipolar Transistors for Automotive Applications", Electrical Overstress/Electrostatic Discharge Symposium (EOS/ESD), 2011, 10 pages.

* cited by examiner

*Primary Examiner* — Nicholas J Tobergte
(74) *Attorney, Agent, or Firm* — Andrew M. Calderon; Roberts Mlotkowski Safran Cole & Calderon, P.C.

(57) ABSTRACT

The present disclosure generally relates to semiconductor structures and, more particularly, to electrostatic discharge protective structures and methods of manufacture. The structure includes: an epitaxial layer comprising a first region, a second region and a third region; a plurality of gate structures connecting the first region to the second region and the second region to the third region; and a plurality of terminals connected to the first region and the third region and the gate structures.

20 Claims, 4 Drawing Sheets

ELECTROSTATIC DISCHARGE PROTECTIVE STRUCTURES

FIELD OF THE INVENTION

The present disclosure generally relates to semiconductor structures and, more particularly, to electrostatic discharge protective structures and methods of manufacture.

BACKGROUND

As semiconductor devices continue to scale downwards, e.g., shrink, the desired spacing between features (i.e., the pitch) also becomes smaller. To this end, in the smaller technology nodes, devices become more vulnerable to external stress. In this way, it becomes ever more difficult to fabricate devices with certain features to guarantee a robust chip due to critical dimension (CD) scaling and process capabilities, as well as materials that are used to fabricate such structures. As the semiconductor market comes to automotive, industrial and medical applications, robust chips are required to compose a safe electronic system.

As an example, electrostatic discharge (ESD) events can cause issues for a transceiver interface in certain applications, e.g., automotive applications. Specifically, Local Interconnect Network (LIN) and Controller Area Network (CAN) bus interfaces can require a relatively high robustness and an area-efficient ESD protection to meet precise standards, e.g., IEC 61000-4-2 and ISO10605, amongst other examples. However, some present ESD protection devices have a limited failure current, which leads to a lack of robustness, and a low holding voltage, which can cause a latch-up issue, and also a relatively too high trigger voltage to provide an effective protection capability. Therefore, a high performance ESD protection device with a relatively high failure current, a high holding voltage and a reasonable trigger voltage is necessary to meet such application.

SUMMARY

In an aspect of the disclosure, a structure comprises: an epitaxial layer comprising a first region, a second region and a third region; a plurality of gate structures connecting the first region to the second region and the second region to the third region; and a plurality of terminals connected to the first region and the third region and the gate structures.

In an aspect of the disclosure, a structure comprises: a plurality of emitters each comprising a lower doped well and a higher doped well; a collector comprising a lower doped well and a higher doped well; and a plurality of shallow trench isolation (STI) structures extending from the higher doped well of the collector through to the higher doped wells of the emitters.

In an aspect of the disclosure, a structure comprises: a p-type substrate; an n-type buried layer over the p-type substrate; an n-type epitaxial layer over the n-type buried layer; a plurality of shallow trench isolation (STI) structures within the n-type epitaxial layer; and deep trench structures surrounding the p-type substrate, the n-type buried layer, the n-type epitaxial layer and the STI structures, wherein: the n-type epitaxial layer comprises a plurality of emitters and a collector, and a plurality of gate structures connect the emitters to the collector.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure generally relates to semiconductor structures and, more particularly, to electrostatic discharge protective structures and methods of manufacture. In embodiments, the processes and structures provided herein use shallow trench isolation (STI) structures or gate structures to reduce a trigger voltage. Advantageously, the reduction in trigger voltage provides an effective electrostatic discharge (ESD) protection capability in a lower voltage application. In this way, the structures and processes described herein can be implemented in certain applications, e.g., automotive applications, without a concern for ESD.

In embodiments, the reduction in trigger voltage is provided by gate structures which extend between emitter and collector devices. Specifically, the boundaries provided by the gate structures reduce the amount of trigger voltage. More specifically, a relatively higher performance device having ESD protection along with a relatively high failure current, a relatively high holding voltage (Vhold) and a relatively smaller trigger voltage (Vt1), is provided. In this way, a compact device with a relatively high failure current, a relatively high holding voltage and a relatively lower trigger voltage is achieved. In alternative embodiments, STI structures extend between the emitter and collector devices, with the boundaries provided by the STI structures reducing the amount of trigger voltage.

In addition, the structures and processes described herein allow for a control of a critical dimension (CD) in a device so that a high holding voltage and a high failure current capability can be achieved. Additionally, the structures described herein provide for a fully symmetrical structure which can achieve a dual polarity ESD protection without a reverse diode, which is not allowed in some applications, e.g. LIN or CAN bus interface in automotive applications. In addition, the structures described herein are able to be stacked for relatively higher voltage applications because of deep trench structures.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Figure 1:
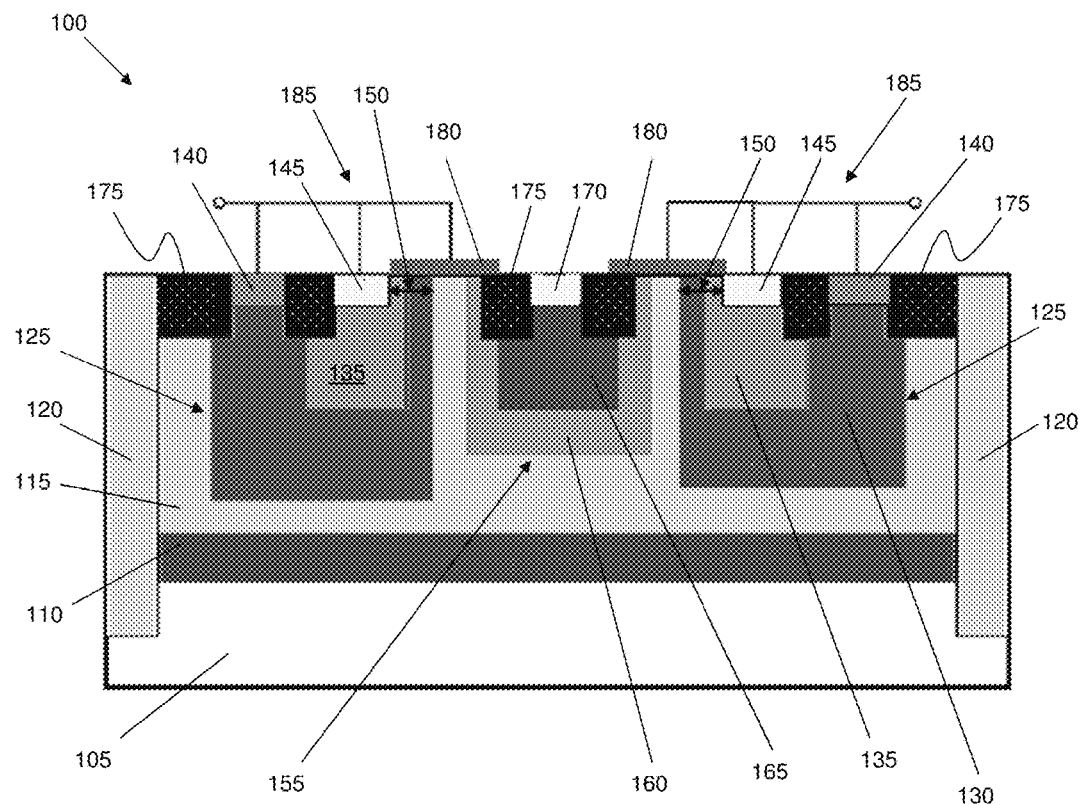
FIG. 1 shows a structure with gate structures, amongst other features, and respective fabrication processes in accordance with aspects of the present disclosure.

FIG. 1 shows a structure and respective fabrication processes in accordance with aspects of the present disclosure. More specifically, FIG. 1 shows a structure 100 comprising a substrate 105 composed of a suitable semiconductor material. For example, the substrate 105 may be composed of any suitable material including, but not limited to, Si, SiGe, SiGeC, SiC, GaAs, InAs, InP, etc. In embodiments, the substrate 105 is a p-type substrate doped with a p-type species, e.g., boron, for example.

An n-type buried layer (NBL) 110 is formed on the substrate 105. In embodiments, an oxide layer is deposited over the substrate 105 and is implanted with an n-type species, e.g., phosphorus, to form the NBL 110. In this way, the n-type buried layer, i.e., the NBL 110, is over the p-type substrate, i.e., the substrate 105. An epitaxial layer 115 is deposited over the NBL 110. In embodiments, the epitaxial layer 115 is an n-type epitaxial layer. In this way, an n-type epitaxial layer, i.e., the epitaxial layer 115, is over the n-type buried layer, i.e., the NBL 110.

Deep trench (DT) structures 120 are formed through the substrate 105, the NBL 110 and the epitaxial layer 115. The DT structures 120 can be formed by conventional processes, for example, lithography, etching and deposition processes. As an example, a resist (not shown) can be deposited on the epitaxial layer 115, which is then patterned by exposure to light using conventional lithographic processes. Following the resist patterning, an etching process, e.g., a reactive ion etching (RIE) process, is used to form a trench for the DT structures 120. The resist is removed, and an oxide fill process is used to fill the trench. Any excess oxide material can be removed by a conventional chemical mechanical polish (CMP). In embodiments, the DT structures 120 insulate the epitaxial layer 115 and the NBL 110. Further, the DT structures 120 allow for the structure 100 to be stacked for relatively higher voltage applications.

Continuing with FIG. 1, the epitaxial layer 115 includes emitter regions 125 and a collector region 155. In embodiments, the emitter regions 125 are separated from the collector region 155 by the epitaxial layer 115. Specifically, the epitaxial layer 115 comprises a first region, i.e., an emitter region 125, a second region, i.e., the collector region 155, and a third region, i.e., another emitter region 125. In this way, the first region and the third region are each emitters, i.e., emitter regions 125, while the second region is a collector, i.e., the collector region 155.

The emitter regions 125 include a high voltage p-well 130 (HVPW) (e.g., implanted at approximately $1E^{16}$-$1E^{17}$); whereas the collector region 155 includes a high voltage n-type drifting voltage (HVNDDD) 160, i.e., doped with phosphorus at a range of about $5E^{16}$-$1E^{17}$. In embodiments the emitter regions 125 also include a middle voltage p-well (MVPW) 135, a p-type (P+) region 140 and an n-type (N+) region 145. In embodiments, the HVPW 130, i.e., the higher voltage well, has a lower doping concentration than the MVPW 135, i.e., the middle voltage well. For example, the HVPW 130 has a doping concentration in a range of about $1E^{16}$-$1E^{17}$, while the MVPW 135 has a doping concentration in a range of about $1E^{17}$-$5E^{17}$. The P+ region 140 and the N+ region 145 are formed by a single implantation process, as described herein. In this way, the emitters, i.e., the emitter regions 125, each comprise multiple wells, i.e., the HVPW 130 and MVPW 135. More specifically, these multiple wells include a lower doped well, i.e., HVPW 130, and a higher doped well, MVPW 135. The regions 135, 140, 145 can be formed by separate implantation processes involving protective masks (not shown) to cover the DT structures 120 and portions which are not being implanted. For example, in embodiments, the HVPW 130 is formed by doping an exposed portion of the epitaxial layer 115 with a p-type species, e.g., boron, while the remaining portions remain protected.

FIG. 1 further shows a base length 150 between an edge of the N+ region 145, through the MVPW 135, to an outer edge of the HVPW 130. Specifically, the base length 150 is measured between an edge of the n-type region 145 through the higher doped well, i.e., the MVPW 135, to an edge of the lower doped well, i.e., the HVPW 130, for increasing a failure current. Specifically, as the base length 150 increases, the holding voltage (Vhold) and the failure current increase. In this way, the larger the length of the base length 150, the greater the device performance. This critical dimension, i.e., the base length 150, can be controlled to achieve a relatively high holding voltage (Vhold) and a high failure current capability ESD devices. Additionally, the base length 150 establishes that the structures, i.e., the emitter regions 125, are symmetrical with respect to each other. In this way, the structure 100 is a fully symmetrical structure, allowing for a dual polarity ESD protection without a reverse diode, which is not allowed in some applications, e.g. LIN or CAN bus interface in automotive applications.

The collector region 155 comprises a high voltage n-type drifting voltage (HVNDDD) region 160, a middle voltage n-well (MVNW) 165 and an n-type (N+) region 170. In this way, the first and third regions, i.e., the emitter regions 125, each comprise an n-type region 145 and a p-type region 140, while the second region, i.e., the collector region 155, comprises an n-type region 170. In embodiments, the HVNDDD region 160 is formed by doping an exposed portion of the epitaxial layer 115, with an n-type species, e.g., phosphorus, causing the lower doped well of the collector to be an n-type drifting region.

The MVNW 165 is formed by implanting an exposed portion of the HVNDDD region 160, with an n-type species, e.g., phosphorus. In embodiments, the HVNDDD region 160 has a lower doping concentration than the MVNW 165, since the HVNDDD region 160 has a higher voltage than the MVNW 165. For example, the MVNW 165 can have a doping concentration in a range of about $5E^{16}$-$1E^{17}$, whereas the HVNDDD region 160 can have a lower doping concentration. In this way, the collector, i.e., the collector region 155, comprises a lower doped well, i.e., the HVNDDD region 160, and a higher doped well, i.e., the MVNW 165. As shown in FIG. 1, the junctions of the HVPW 130 are deeper than the junction of the HVNDDD 160. For example, in embodiments, the energy of implantation for the HVPW 130 causes the diffusion process to go deeper into the epitaxial layer 115, resulting in deeper junctions for the HVPW 130 compared to the junction of the HVNDDD 160.

Shallow trench isolation (STI) structures 175 are formed within the epitaxial layer 115, and specifically, within the emitter regions 125 and the collector region 155. In embodiments, the STI structures 175 can be formed by conventional lithography, etching and deposition processes, for example. Following the etching process, an oxide material is deposited within the trenches, and a chemical mechanical polishing (CMP) process is used to remove any excess material on a surface of the epitaxial layer 115. In embodiments, the STI structures 175 formed within the emitter regions 125 and are also formed between the P+ region 140 and the N+ region 145. In this way, the STI structures 175 separate the n-type region 145 from the p-type region 140 of the first region and the third region, i.e., the emitter regions 125. In the collector region 155, the STI structures 175 are on each side of the N+ region 170. That is, the n-type region 170 of the second region, i.e., the collector region 155, is surrounded by the STI structures 175. As can be seen in FIG. 1, the DT structures 120 surround the p-type substrate, i.e., substrate 105, the n-type buried layer, i.e., the NBL 110, the n-type epitaxial layer, i.e., the epitaxial layer 115, and the STI structures 175.

Continuing with FIG. 1, extending between each emitter region 125 and collector region 155 is a gate structure 180. In this way, a plurality of gate structures 180 connects the first region, i.e., an emitter region 125, to the second region, i.e., the collector region 155, and the second region to the third region, i.e., another emitter region 125. The gate structures 180 can be fabricated using any known gate formation processes, e.g., replacement gate fabrication processes or gate first processes as is known in the art.

In embodiments, a gate boundary of the gate structure 180 touches the N+ region 145 inside the emitter region 125 and overlaps with the STI structures 175 in the collector region 155. Specifically, a gate boundary of the gate structures 180 touches the n-type region 145 of the first region and the n-type region 145 of the third region, i.e., the emitter regions 125, and overlap the STI structures 175 in the second region, i.e., the collector region 155. In this way, underneath each gate structure 180 is the MVPW 135, the HVPW 130, the epitaxial layer 115, the HVNDDD region 160 and the STI structures 175 in sequence from the emitter regions 125 to the collector region 155. More specifically, the gate structures 180 connect the lower doped well, i.e., the HVNDDD region 160, and the higher doped well, i.e., the MVNW 165, of the collector region 155, to the lower doped well, i.e., the HVPW 130, and the higher doped well, i.e., the MVPW 135, of the emitters regions 125, respectively.

Terminal structures 185 are tied to each gate structure 180. In this way, a plurality of terminals, i.e., terminal structures 185, connect to the first region and the third region, i.e., emitter regions 125, and the gate structures 180. In embodiments, the terminal structures 185 are three-pronged structures connecting each emitter region 125 with the collector region 155. Specifically, each terminal structure 185 ties both the P+ region 140 and the N+ region 145 inside the emitter region 125 with the gate structure 180, using a metal line. In this way, the plurality of terminal structures 185 tie together the n-type regions 145 with the p-type regions 140 of the emitter regions 125.

The gate boundary provided by the gate structure 180 allows for a reduction in trigger voltage to support a larger range of pins. Specifically, the structures and processes described herein leverage the epitaxial layer 115 along with the gate structure 180, e.g., poly gate structure, to provide a relatively lower range of triggering voltage, thereby eliminating a need for an additional N+ sinker layer to the NBL 110. Advantageously, the reduction in trigger voltage provides an effective ESD protection capability in a more compact device. In this way, the structures and processes described herein can be implemented in certain applications, e.g., automotive applications, without a concern for ESD.

Figure 2:
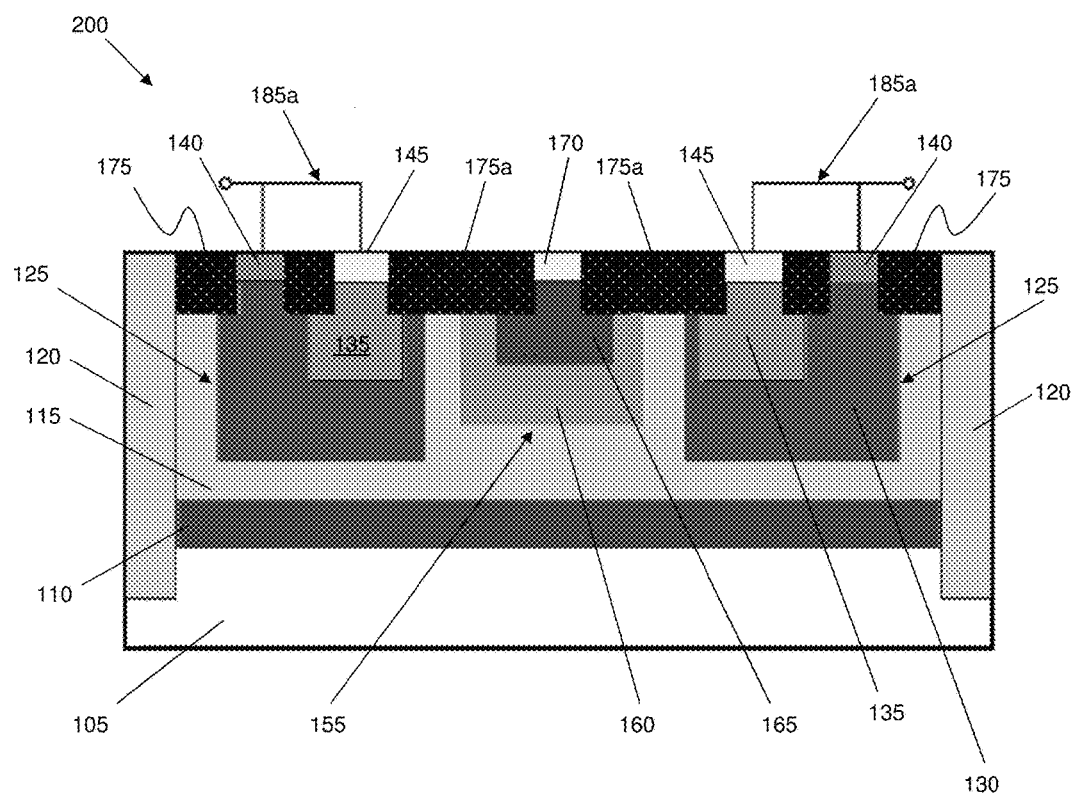
FIG. 2 shows an alternative structure without gate structures, amongst other features, and respective fabrication processes in accordance with additional aspects of the present disclosure.

FIG. 2 shows an alternative structure 200 in accordance with aspects of the present disclosure. In contrast to structure 100 of FIG. 1, additional STI structures 175a are provided in lieu of gate structures, and extend from the collector region 155 and into the emitter regions 125. In this way, structure 200 has terminal structures 185a with less contacts than structure 100.

Similar to the structures and processes described for FIG. 1, the structure 200 includes the p-type substrate 105, the NBL 110, the epitaxial layer 115, the DT structures 120, the emitter regions 125 and the collector region 155. The emitter regions 125 each comprise the HVPW 130, the MVPW 135, the P+ region 140 and the N+ region 145. The collector region 155 comprises the HVNDDD region 160, the MVNW 165 and the N+ region 170. In structure 200, the junctions of the HVPW 130 are deeper than the junction of the HVNDDD 160. The energy of implantation for the HVPW 130 causes the diffusion process to go deeper into the epitaxial layer 115, thereby resulting in deeper junctions for the HVPW 130 than the junction of the HVNDDD 160.

Structure 200 includes the STI structures 175, 175a, which are formed within the emitter regions 125 and the collector region 155, respectively. In embodiments, the STI structures 175 formed within the emitter regions 125 are formed between the P+ region 140 and the N+ region 145. In the collector region 155, the STI structures 175a are formed on each side of the N+ region 170 and extend to the emitter region 125. Specifically, the STI structures 175a extend from each side of the N+ region 170, through the MVNW 165, the HVNDDD region 160 and the gap of epitaxial layer 115 separating each emitter region 125 and the collector region 155, through the HVPW 130 and the MVPW 135, to a side of the N+ region 145 of the collector region 155. More specifically, the STI structures 175a extend from surfaces of the n-type region 170 of the collector region 155 to the higher doped wells, i.e., the MVPW 135, of the emitter regions 125. In this way, a plurality of STI structures 175a extend from the higher doped well, i.e., the MVNW 165, of the collector region 155, through to the higher doped wells, i.e., the MVPW 135, of the emitter regions 125. The terminal structures 185a tie the P+ region 140 with the N+ region 145 of each emitter region 125, using a metal line. In embodiments, the terminal structures 185a can be two-pronged terminals, for example.

Figure 3:
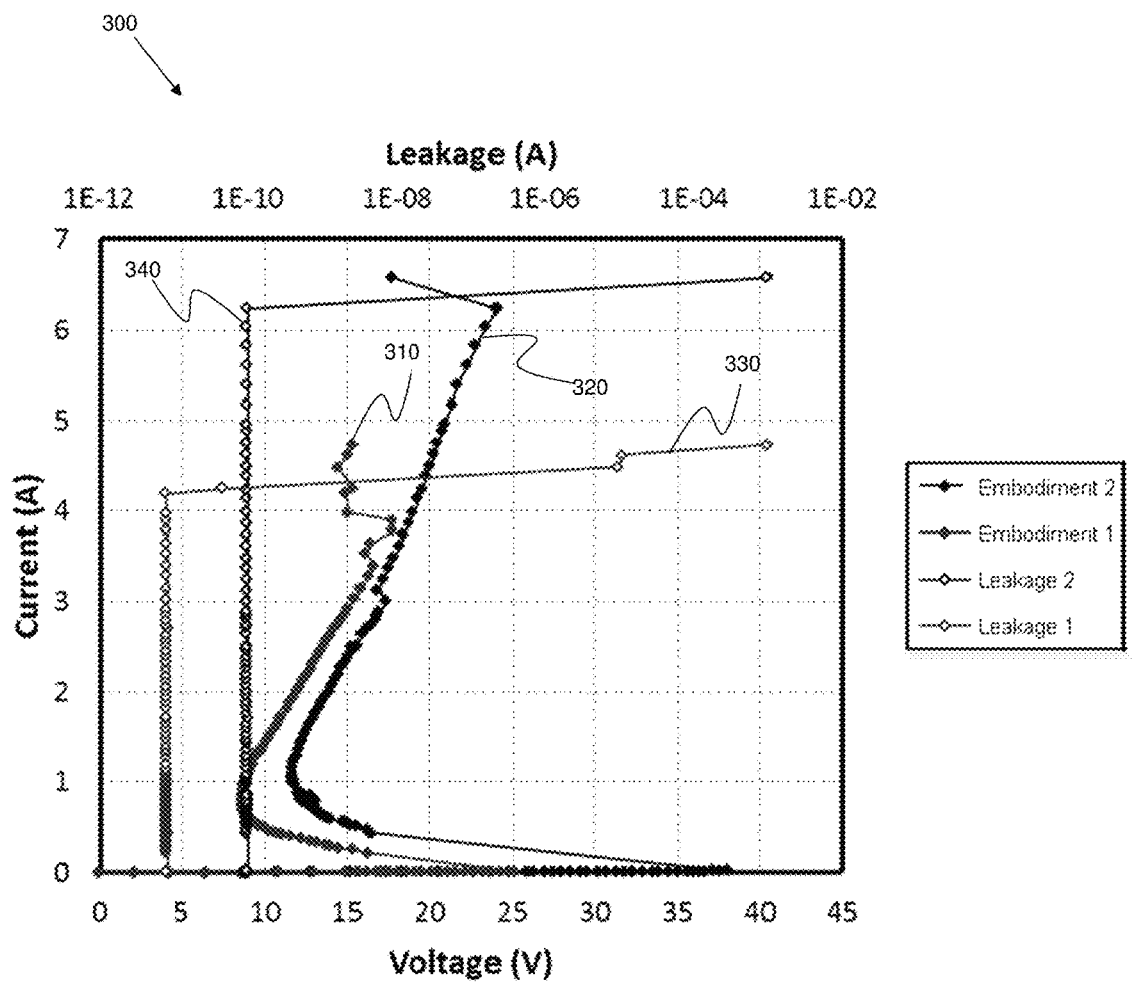
FIGS. 3 and 4 show various results for the structures of FIGS. 1 and 2, in accordance with aspects of the present disclosure.

FIG. 3 illustrates graph 300 for both structures of FIGS. 1 and 2. Specifically, line 310 shows the results for the structure of FIG. 1 (embodiment 1), while line 320 shows the results for the structure of FIG. 2 (embodiment 2). Further, line 330 shows the results for a leakage of embodiment 1, while line 340 shows the results for a leakage of embodiment 2. As shown in FIG. 3, structure 100 of FIG. 1 having the gate boundary design, has a reduced triggering voltage (Vt1) than structure 200 of FIG. 2. Specifically, Vt1 has gone from 38V with structure 200 to 25V with structure 200. In this way, there is a relatively much smaller snapback voltage gap. In addition, embodiment 2 of structure 200 has a relatively much higher failure current than embodiment 1 of structure 100. However, embodiment 2 still has a higher Vt1 than embodiment 1.

Figure 4:
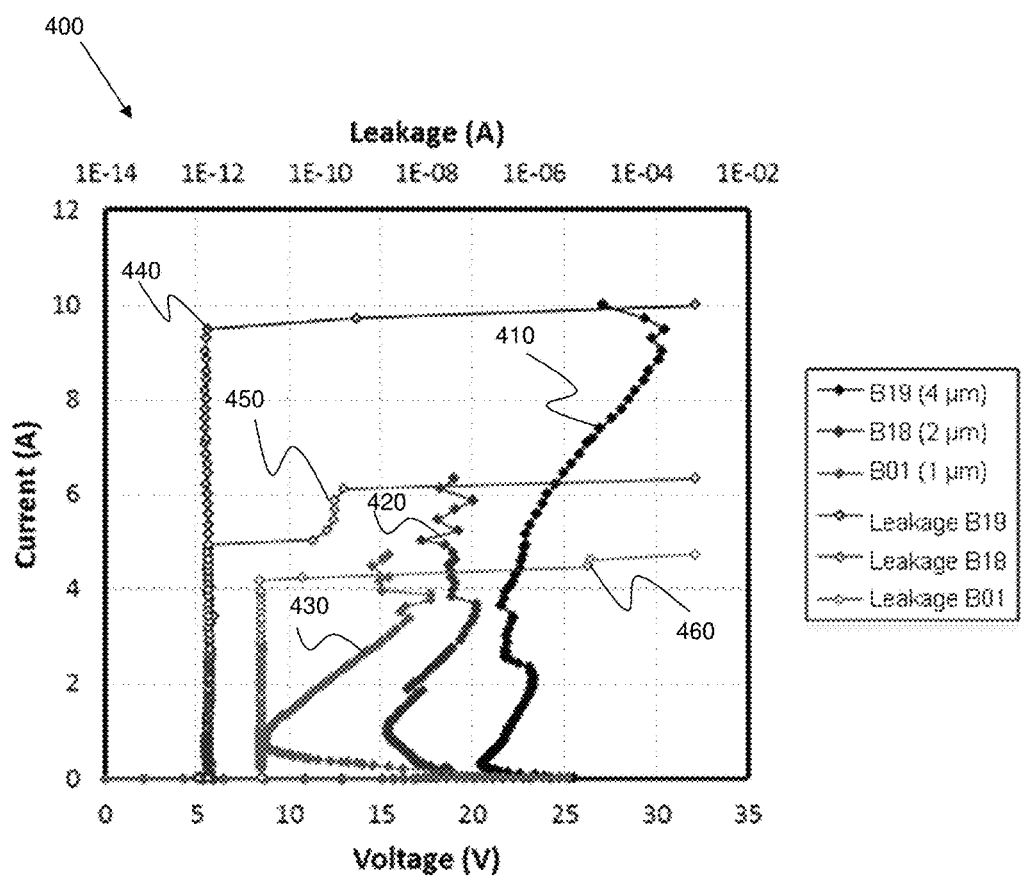

FIG. 4 illustrates graph 400 with respect to the base length 150 of structure 100 in FIG. 1. Line 410 illustrates a device (B19) with a base length 150 length of 4 µm, line 420 illustrates a device (B18) with a base length 150 length of 2 µm and line 430 illustrates a device (B01) with a base length 150 length of 1 µm. In addition, line 440 illustrates a leakage of the B19 device, line 450 illustrates a leakage of the B18 device and line 460 illustrates a leakage of the B01 device.

As shown in graph 400, as the base length 150 becomes larger, the holding voltage (Vhold) improves, and so does the failure current. Specifically, Vhold improves from 8.7 V for the B01 device, to 15.4 V for the B18 device and 20.5 V for the B19 device. Further, the failure current improves from 4.2 A for the B01 device, to 6.1 A for the B18 device and 9.5 A for the B19 device. Accordingly, graphs 300, 400 illustrate that the structures having a gate boundary have a reduced trigger voltage, combined with the feature of base length 150 control, allows for a relatively high performance ESD protection structure with a relatively high failure current, a relatively high Vhold and a relatively smaller Vt1. Graph 400 is summarized in Table 1 below.

TABLE 1

| DUT | Base Length (um) | Vhold (V) | Failure Current (A) |
| --- | --- | --- | --- |
| B01 | 1 | 8.7 | 4.2 |
| B18 | 2 | 15.4 | 6.1 |
| B19 | 4 | 20.5 | 9.5 |

It should now be understood that the processes and resultant structures described herein will allow devices to be implemented in certain applications, e.g., automotive applications, which require a relatively high robustness and an area-efficient electrostatic discharge (ESD) protection to meet precise standards, e.g., IEC 61000-4-2 and ISO10605. These ESD protective structures allow for a relatively good control of a critical dimension to achieve a relatively high holding voltage and a relatively high failure current capability. Further, these ESD protective structures are fully symmetrical to allow for a dual polarity ESD protection without a reverse diode, which is not allowed in some applications, e.g. LIN or CAN bus interface in automotive applications. In addition, the gate boundary reduces a trigger voltage to support a relatively larger range of pins. Additionally, the ESD protective structures have deep trench structures, which allows the ESD protective structures to be stacked for relatively higher voltage applications.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
an epitaxial layer comprising a first region, a second region and a third region;
a plurality of gate structures connecting the first region to the second region and the second region to the third region; and
a plurality of terminals connected to the first region and the third region and the gate structures.

2. The structure of claim 1, wherein the epitaxial layer is an n-type epitaxial layer.

3. The structure of claim 1, wherein the first region and the third region are each emitters.

4. The structure of claim 1, wherein the second region is a collector.

5. The structure of claim 4, wherein the first region and the third region are each emitters and the emitters each comprise multiple wells.

6. The structure of claim 5, wherein the multiple wells include a lower doped well and a higher doped well.

7. The structure of claim 6, wherein the collector comprises a lower doped well and a higher doped well.

8. The structure of claim 7, wherein the gate structures connect the lower doped well and the higher doped well of the collector to the lower doped well and the higher doped well of the emitters, respectively.

9. The structure of claim 8, wherein the lower doped well of the collector is an n-type drifting region.

10. The structure of claim 9, wherein the first region and the third region each comprise an n-type region and a p-type region and the second region comprises an n-type region.

11. The structure of claim 10, further comprising a base length between an edge of the n-type region through the higher doped well to an edge of the lower doped well for increasing a failure current.

12. The structure of claim 11, further comprising shallow trench isolation (STI) structures separating the n-type region from the p-type region of the first region and the third region.

13. The structure of claim 12, wherein the n-type region of the second region is surrounded by the STI structures.

14. The structure of claim 13, wherein a gate boundary of the gate structures touch the n-type region of the first region and the n-type region of the third region and overlap the STI structures in the second region.

15. A structure, comprising:
a plurality of emitters each comprising a lower doped p-type well and a higher doped p-type well;
a collector comprising a lower doped n-type well and a higher doped n-type well; and
a plurality of shallow trench isolation (STI) structures extending from the higher doped n-type well of the collector through to the higher doped p-type wells of the emitters.

16. The structure of claim 15, wherein the emitters each further comprise an n-type region and a p-type region.

17. The structure of claim 16, further comprising a plurality of terminals which tie together the n-type regions with the p-type regions of the emitters.

18. The structure of claim 16, wherein the collector further comprises an n-type region.

19. The structure of claim 16, wherein the STI structures extend from surfaces of the n-type region of the collector to the higher doped wells of the emitters.

20. A structure, comprising:
a p-type substrate;
an n-type buried layer over the p-type substrate;
an n-type epitaxial layer over the n-type buried layer;
a plurality of shallow trench isolation (STI) structures within the n-type epitaxial layer; and
deep trench structures surrounding the p-type substrate, the n-type buried layer, the n-type epitaxial layer and the STI structures, wherein:
the n-type epitaxial layer comprises a plurality of emitters and a collector, and a plurality of gate structures connect the emitters to the collector.

\* \* \* \* \*